July 19, 1960 T. A. BYLES ET AL 2,946,015

AMPLIFIER CIRCUIT

Filed Jan. 13, 1956 2 Sheets-Sheet 1

INVENTORS
Theodore A. Byles
BY Bernhard Birkenes
Mueller & Aichele
Attys.

INVENTORS
Theodore A. Byles
BY Bernhard Birkenes
Mueller & Aichele
Attys.

2,946,015

AMPLIFIER CIRCUIT

Theodore A. Byles, Villa Park, and Bernhard Birkenes, Chicago, Ill., assignors to Motorola, Inc., Chicago, Ill., a corporation of Illinois Filed Jan. 13, 1956, Ser. No. 558,875

8 Claims. (Cl. 330—15)

Figures 1, 2, 4:
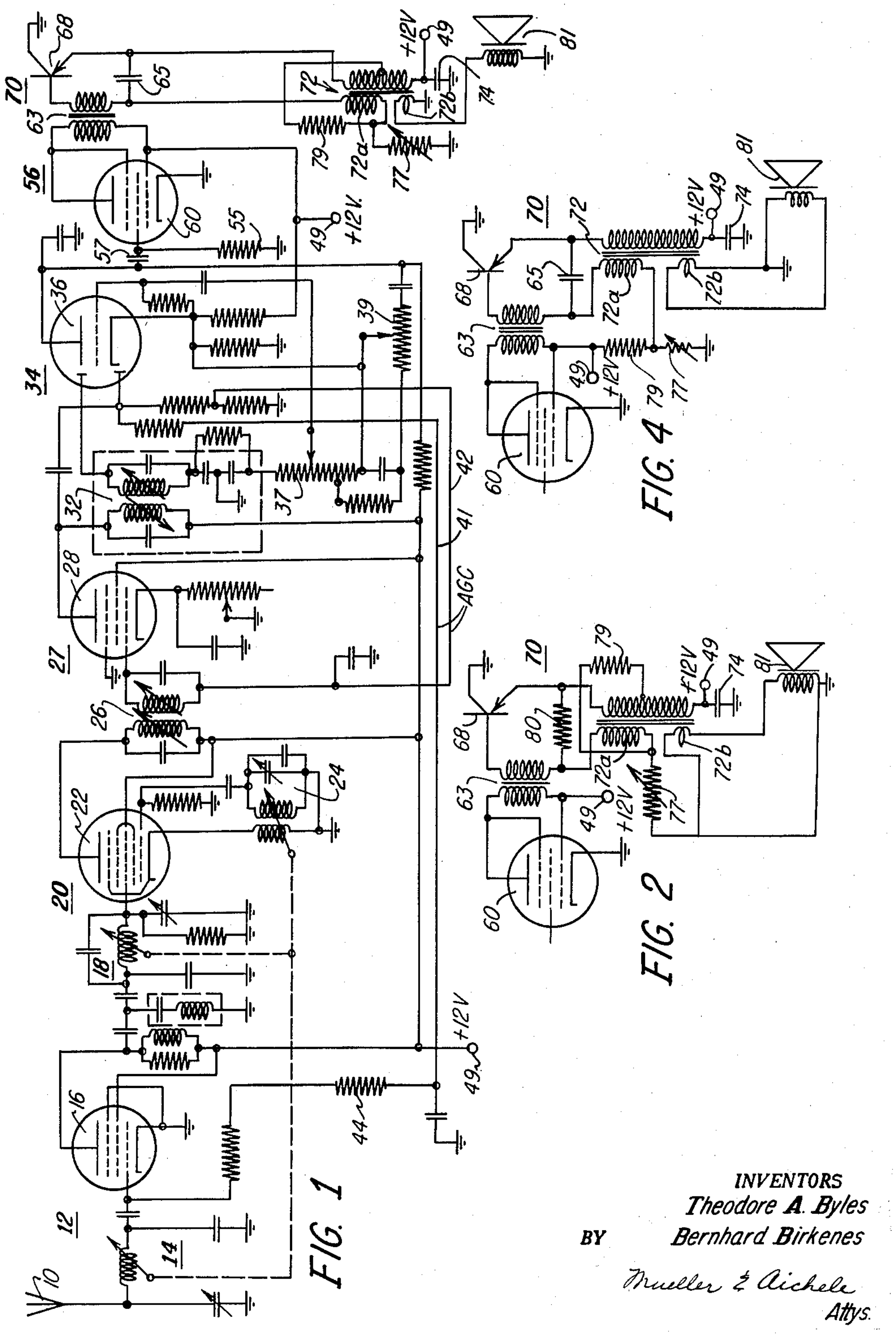

This invention relates to signal amplifiers and more particularly to transistorized signal amplifiers as used in radio receivers and like applications.

The various applications for transistor amplifiers include use in automobile receivers some of which employ vacuum tubes to perform voltage amplification functions and one or more transistors as current amplifiers for driving a loud speaker. In such circuits, in corporating both vacuum tubes and transistors, it has been found possible to provide energization from a single low potential source of the order of 12–15 volts as available in the electrical systems of some automobiles.

A transistor amplifier circuit possessing good current amplification characteristics and one wherein the transistor may be easily cooled is a circuit known as the common emitter type wherein the emitter is common to both input and output circuits. With this type of amplifier heat dissipation is promoted by direct mechanical connection of the collector to chassis ground. Performance may be sacrificed in such a circuit however, by the use of a voltage divider bias network across the energizing source for the collector-emitter to provide a bias voltage for the transistor base also. For example, with the output impedance, or load, coupled between the emitter and the energizing potential source, a voltage divider coupled through the load impedance to the potential source would shunt the load thus reducing the power output of the amplifier. Alternatively a biasing network coupled across the potential source might require that the input signal be applied through the output load impedance thereby obviating the load shunting problem but increasing the input impedance to the amplifier with the possibility of reducing the power gain thereof.

Accordingly, it is an object of this invention to provide an improved transistor amplifier for use in a radio receiver including vacuum tubes and at least one transistor which overcomes one or more of the above described difficulties.

Another object is to provide a transistor amplifier wherein the emitter is common to input and output circuits thereof and in which a biasing system for the base of the transistor does not dissipate any substantial amount of the output signal of the amplifier.

Still another object is to provide a grounded collector, common emitter transistor amplifier which operates from a single potential source and which exhibits improved characteristics including increased power gain and low signal distortion.

A feature of the invention is the provision of a transistor amplifier including a voltage divider network coupled across a single power source to furnish bias for the base electrode; input and output circuits connected in common to the emitter; and an impedance device in the voltage divider network across which appears a signal equal to the output signal of the amplifier to minimize current flow of the output signal in the divider network.

Another feature of the invention is the provision of a grounded collector, common emitter transistor amplifier with input and output circuits connected to the emitter of the transistor; a voltage divider biasing network to supply a bias to the base of the transistor; and an output transformer included in the output circuit and having a secondary winding coupled to the biasing network for opposing output signals otherwise appearing therein through interconnection of the output circuit to the biasing network.

Further objects, features and the attending advantages of the invention will be apparent upon consideration of the following description when taken in conjunction with the accompanying drawings in which:

Fig. 1 is a schematic diagram of a radio receiver incorporating the improved transistor amplifier of the present invention; and Figs. 2–5 are schematic diagrams of modified forms of the amplifier.

The preferred form of the invention comprises a transistor amplifier constructed with the collector of the transistor directly grounded. Input and output circuits for the amplifier are both coupled to the emitter of the transistor. The output circuit includes a primary winding of an output transformer which thus comprises a load or output impedance for the amplifier and which is connected to a potential supply for the amplifier. Also incorporated is a voltage divider network coupled to the potential supply and having a point therein connected to the base of the transistor for biasing this element. A secondary winding of the transformer is coupled into the biasing network so that a potential approximately equal to the output signal appears in this network thus substantially reducing current flow of the output signal in this network. Accordingly, the power gain of the amplifier is maximized since signal loss in the biasing network is minimized. A portion of the primary winding may also be included in the input circuit to provide a variation in the input impedance to the amplifier as well as to incorporate a desired amount of negative feedback in the system for reducing distortion. The resistance of such a portion of the primary winding to the emitter of the transistor may also be utilized as a stabilizing resistor for the transistor thus preventing "runaway" by means of small self-bias for the emitter obtained with this resistance.

Fig. 1 illustrates a radio receiver incorporating one form of the invention. In this receiver an antenna 10 is coupled to a radio frequency amplifier stage 12 through a tuned circuit network 14. Stage 12 includes a vacuum tube 16 from which received signals are applied through tuned circuit network 18 to the mixer-oscillator stage 20, employing vacuum tube 22. Tube 22 includes a portion providing local oscillations regulated in frequency by tuned circuit network 24, a variable provision of which network is ganged with similar variable provisions of networks 14 and 18 to provide tuning of the entire receiver. Through heterodyne action in tube 22 a received signal is converted to a signal of intermediate frequency after which it is applied through transformer 26 to the intermediate frequency amplifier stage 27. Stage 27 includes vacuum tube 28 which amplifies the intermediate frequency signal and supplies the same through transformer 32 to the demodulator and first audio amplifier stage 34. Vacuum tube 36 in stage 34 includes a rectifier section which demodulates the intermediate frequency signal and a portion of this demodulated signal is tapped from volume control 37 and applied to a triode amplifying section of tube 36. A tone control 39 is also provided and associated resistance and capacitor components constitute a network of variable frequency response for regulation of the total response of the receiver in a manner understood by those skilled in the art. A positive energizing potential of the order of 12 volts is applied to intercoupled terminals 49. It has been found that the receiver as shown and described will operate successfully from a potential of the order of 12–15 volts, and as pointed out previously, this is available in the electrical systems of some automobiles so that no additional circuitry need be used to obtain a high voltage energizing potential.

Tube 36 also provides an automatic gain control potential (AGC voltage) proportional to the level of the received signal and this is coupled to lines 41 and 42 for the purpose of regulating the gain of the receiver. Line 41 is coupled through resistor 44 to the control grid of tube 16 and line 42 is direct current coupled to the control grid of tube 28. The gain of these tubes is thus regulated in indirect relation to the level of signal being received.

The amplified audio signal from tube 36 is applied across grid leak resistor 55 and to audio amplifier stage 56 through coupling capacitor 57. Capacitor 57 and resistor 55 are both coupled to the second gird of vacuum tube 60 in stage 56. The cathode of tube 60 is grounded and the first grid thereof is coupled to terminal 49 or the energizing potential source. The anode and third grid of tube 60 are also coupled to the positive potential source through the primary winding of transformer 63. It should be pointed out that the connections of the first and second grids of tube 60 are reversed over that normally used and this is done to provide a steeper potential gradient adjacent the cathode of tube 60 and to reduce the presence of a space charge about this cathode which otherwise might accumulate because of the low anode potential. This system as shown tends to provide increased tube current and amplification at low energizing potentials of the order of 12 volts as used in the receiver being described.

The secondary winding of transformer 63 is serially connected with capacitor 65 across the base and emitter elements of transistor 68 in the final audio amplifier stage 70. The collector electrode of transistor 68 is connected directly to ground so that stage 70 may be termed a grounded collector, common emitter transistor amplifier which characteristically provides good heat dissipation from the collector directly to the chassis or ground of the apparatus. Output transmformer 72 includes a primary winding coupled between the emitter and the positive potential source. Bypass to ground for audio signals at terminals 49 is effected through capacitor 74 which is connected across the energizing source. Transformer 72 includes a secondary wniding 72*a* coupled through the secondary winding of transformer 63 to the base of transistor 68 and to ground through variable resistor 77. A resistor 79 is also connected from a tap point on the primary winding of transformer 72 to the junction of winding of 72*a* and resistor 77. A loud speaker 81 for reproducing the audio signals developed by the receiver is coupled directly across secondary winding 72*b* of transformer 72. One side of winding 72*b* is also grounded.

It may be seen that signals are applied to stage 70 by means of the secondary winding of transformer 63 and capacitor 65 so that such signals appear between the base and emitter of transistor 68. Furthermore the output signals are developed in the primary winding of transformer 72 which applies the signals to speaker 81 by means of winding 72*b*. It should also be pointed out that a direct current path is provided from ground through resistor 77, resistor 79 and a portion of the primary winding of transformer 72 back to the potential source. Therefore the potential existing at the junction of resistors 77 and 79 will be applied through winding 72*a* and the secondary winding of transformer 63 to the base of transistor 68. Adjustment of resistor 77 may be made to regulate the value of this bias potential for the base. Winding 72*a* is, of course, inductively coupled to the primary winding of transformer 72 and has a turn ratio such that a voltage appears thereacross which is substantially equal to the output signal appearing between the tap point of the primary winding of transformer 72 and the emitter of the transistor. Thus it may be noted that the output signal appearing across capacitor 65 will be equal at both ends thereof and that the output signal appearing across resistor 79 will be equal at the opposite ends thereof. Furthermore, a voltage appears across winding 72*a* which is substantially equal to the output signal appearing between the primary tap point and capacitor 74. Thus it is apparent that since resistors 79 and 77 are connected between equi-potential points, relative to the output signal, no significant signal currents can flow through them, and therefore there is no loss of signal power in these bias resistors.

The exact function of winding 72*a* may be appreciated by considering a direct connection of the junction of resistors 77 and 79 to the junction of the secondary winding of transformer 63 and capacitor 65. In such a case a portion of the primary winding of transformer 72 would in effect be shunted by resistors 77, 79 and capacitor 74 (which normally has a low impedance for audio signals). The remainder of the primary winding of transformer 72 would also be effectively shunted through capacitor 65 and resistor 77 and capacitor 74. Thus a considerable portion of the output signal would be dissipated in the biasing network which would accordingly reduce the gain of the entire stage. However, with the circuit as shown and described signal loss in the biasing network is minimized thus maximizing power gain of the stage.

A small self-biasing resistance is also provided for the emitter of transistor 68 through the resistance of the portion of the primary winding of transformer 72 existing between the tap point thereof and the emitter of the transistor. Resistance of this portion of the transformer primary winding is in the direct current path to the emitter element and tends to decrease the potential on the emitter as greater current is drawn therethrough so that the stage is stabilized at the time when the power is first applied thereto. This prevents the occurrence of what is known in the art as "runaway" wherein a transistor draws increasingly greater current to the damage point of the system.

Typical values of components for a practical construction of amplifier 70 in Fig. 1 are as follows:

| | |
|---|---|
| Transformer 63 | 5:1 turns ratio. |
| Capacitor 65 | 200 mfd. |
| Transistor 68 | 2NJ4 (Motorola type). |
| Transformer 72 | pri. 165 turns, tapped 40% from top winding 72*a*, 70 turns winding 72*b*, 57 turns. |
| Resistor 77 | 500 ohms. |
| Resistor 79 | 27 ohms. |
| Capacitor 74 | by-pass at audio frequencies. |

Figure 3:
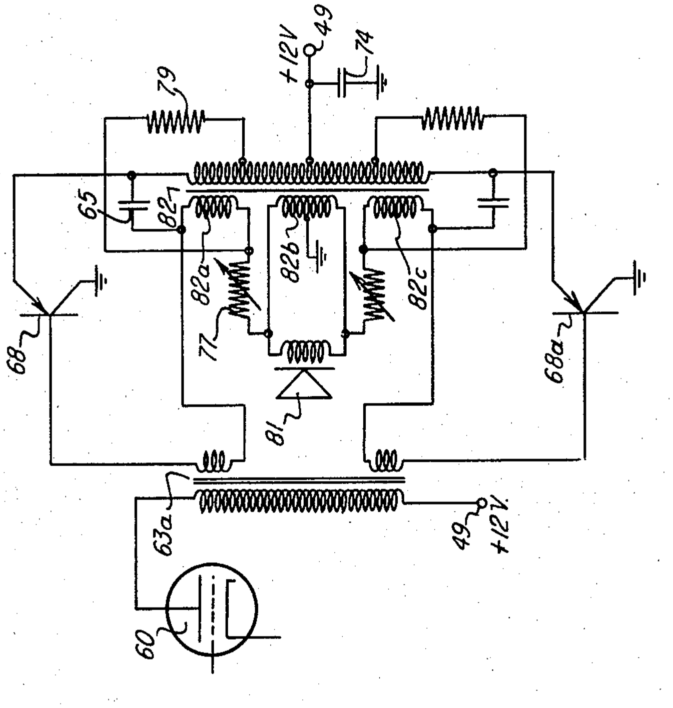

The circuit of Fig. 3 may also function with capacitor 65 omitted. In such case the input impedance would include the resistance of resistor 79. However, equal and opposite portions of input signal would appear across winding 72*a* and the upper portion of the primary winding of transformer 72 so that the effect of these windings would be offset. There would be some negative feedback to reduce distortion in this modification due to the common impedance in the output and input circuits, viz. the upper portion of the primary winding of transformer 72.

Fig. 2 is a schematic diagram of amplifier stage 70 as modified by substituting resistor 80 for capacitor 65 and by returning resistor 77 to ground through winding 72*b*. As compared with the circuit of Fig. 1 the circuit of Fig. 2 is less expensive since the cost of resistor 80 would most likely be less than the cost of capacitor 65. It has been found that by proper selection of the value of resistor 80 very satisfactory performance of the circuit may be obtained. A small value of this resistor will degrade the direct current stability of the circuit while a large value of this resistor will decrease the signal power gain. In a practical construction of this circuit the following component values were employed:

| | Ohms |
|---|---|
| Resistor 77 | 100 |
| Resistor 79 | 10 |
| Resistor 80 | 22 |

The values of the remaining components were as given above.

Fig. 3 shows a push-pull version of the transistor amplifier of Fig. 1. In this circuit transformer **63*a* applies balanced signals to transistors 68 and 68*a* which are coupled to separate secondary windings of this transformer. The input to transistor 68 is applied through capacitor 65 and across the base and emitter electrodes. A voltage divider network is connected across the potential supply as provided at terminal 49 and consists of a portion of output secondary winding 82*b*, resistors 77 and 79 and a portion of the primary winding of transformer 82. A bias potential existing at the junction of resistors 77, 79 is applied through secondary winding 82*a* and a secondary winding of transformer 63*a* to the base of transistor 68. One-half of this push-pull circuit differs from the circuit shown in Fig. 1 in that a portion of the output winding 82*b* is included in the biasing network. However, this winding has but little effect on the D.C. operation of the network, and one-half of this winding together with the secondary winding 82*a* provides the necessary opposing signal in the biasing network so that virtually none of the output signal from the primary winding of transformer 82 will be shunted therethrough. The connection and operation of transistor 68*a* is similar to that given for transistor 68 and connections to transistor 68*a* are made to corresponding portions of transformers 63*a* and 82** to effect push-pull operation of the system.

Fig. 4 shows a modified form of the circuit of Fig. 1 wherein corresponding components are given the same reference numerals. In this circuit however, resistor 79 is coupled from the junction of resistor 77 with winding **72*a* to the energizing potential source. Therefore, the direct current flowing in the combination of resistors 77 and 79 will not be flowing in the primary winding of transformer 72. As in the circuit described in Fig. 1, winding 72*a* is inductively coupled to the primary winding of transformer 72 so that a voltage equal to the output signal in the primary is developed across winding 72*a*. Accordingly, there will be no current flow of the output signal through capacitor 65 and resistor 77 or resistor 79** so that the output signal is not dissipated in the biasing network.

Figure 5:
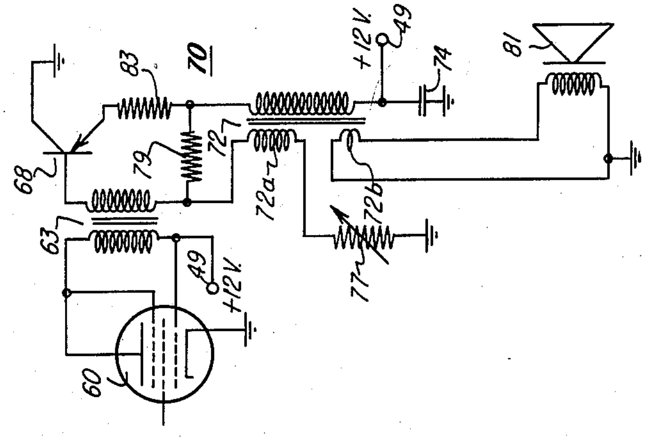

In the circuit of Fig. 5 components corresponding to those of Figs. 1 and 4 are given the same reference numerals. In this circuit winding **72*a*, resistor 77 and winding 72*b* are series connected between ground and the junction of the secondary winding of transformer 63 and resistor 79. Furthermore, resistor 79 is connected through resistor 83 to the emitter of transistor 68 and the primary winding of transformer 72 is coupled between terminal 49 and the junction of resistors 79, 83. Accordingly, a direct current path is provided through resistor 77, winding 72*a*, resistor 79, and the primary winding of transformer 72. Thus a bias potential is applied through the secondary winding of transformer 63 to the base of transistor 68. As in the previous circuit adjustment of resistor 77 will regulate the size of this bias. A signal substantially equal to the output signal appearing across the primary winding of transformer 72 also appears across winding 72*a* so that there will be no current flow of the output signal through the bias network just as in the previously described circuits. It may also be appreciated that resistor 77 could be inserted between winding 72*a* and resistor 79 with the lower end of winding 72*a*** directly grounded without changing the essential operation of the system.

In the circuit of Fig. 5 resistor 83 provides self-biasing action for transistor 68 to prevent "runaway" as discussed in connection with the circuit of Fig. 1. Since capacitor 65 has been omitted in the circuit of Fig. 5, input is applied from the secondary winding of transformer 63 through resistors 79 and 83 to the base and emitter electrodes of the transistor. Thus the input impedance to the amplifier will include these resistances. Of course, it would also be possible to connect capacitor 65 directly across resistor 79 and thus alter the input impedance without influencing the operation of the system with respect to direct current. Furthermore, it is also possible to connect the end of resistor 79 which is coupled to resistor 83, to a tap point on the primary winding of transformer 72 in which case a portion of the D.C. resistance of this primary winding may be utilized as a self-biasing resistor for the transistor thus doing away with the need for resistor 83. By using a connection of this sort and omitting capacitor 65, the input circuit to the amplifier would include a portion of the primary winding of transformer 72 and thus a portion of the output impedance. Accordingly, it may be seen that the input impedance to the amplifier can be varied by the location of this tap point and that a desired amount of negative feedback may be obtained in accordance with the location of this tap point thereby reducing distortion of the amplified signal.

This invention provides therefore, an improved amplifier circuit utilizing a grounded collector transistor in which the power gain is high and none of the heat dissipation characteristics are sacrificed. Furthermore, the circuit is simple in construction and requires but a minimum of inexpensive circuit components. A transistor performing a current amplification function is used in conjunction with vacuum tubes performing voltage amplification functions, thus fulfilling the requirements of a complete radio receiver. The system as described herein provides a low, and/or selectable, input impedance into the transistor stage and, in order to maintain high power gain of this stage, the output signal is not appreciably dissipated in the voltage divider network providing bias for the transistor base.

What is claimed is:

1. A transistor amplifier including in combination a transistor having base, emitter and collector electrodes, potential supply means, means directly coupling said collector electrode to a reference point, series coupled input inductor means and capacitor means respectively connected between said base electrode and said emitter electrode for applying input signals to said transistor, an output transformer having a tapped primary winding coupled between said emitter electrode and said potential supply means for deriving an output signal from said amplifier, said output transformer having a secondary winding in which appears a signal corresponding to the output signal developed in said primary winding, bias resistor means coupled to a reference point and to the tap of said primary winding, said secondary winding being coupled between an intermediate point of said resistor means and said input inductor means to apply a bias therethrough to said base electrode, so that the signal induced in said secondary winding from said primary winding prevents loss of the output signal through said capacitor means, and a portion of said tapped primary winding provides stabilization means for said emitter electrode.

2. A transistor amplifier including in combination a transistor having base, emitter and collector electrodes, potential supply means, means directly coupling said collector electrode to a reference point, series coupled input inductor means and capacitor means respectively connected between said base electrode and said emitter electrode for applying input signals to said transistor, an output transformer having a primary winding coupled between said base electrode and said potential supply means, said output transformer having a secondary winding in which appears a signal corresponding to the output signal developed in said primary winding, and bias resistor means coupled to said potential supply means and the reference point, means coupling said secondary winding between said resistor means and said input inductor means to apply a bias therethrough to said base electrode, so that the signal induced in said secondary winding from said primary winding reduces signal loss through said bias resistor means.

3. A transistor amplifier including in combination a transistor having base, emitter and collector electrodes, potential supply means, means directly coupling said collector electrode to a reference point, series coupled input inductor means and first resistor means respectively connected between said base electrode and said emitter electrode for applying input signals to said transistor, an output transformer having a primary winding coupled between said first resistor means and said potential supply means, said output transformer having a secondary winding in which appears a signal corresponding to the output signal developed in said primary winding, second resistor means coupled to a reference point and through said secondary winding to the interconnection of said first resistor means and said input inductor means to apply a bias therethrough to said base electrode, so that the signal induced in said secondary winding from said primary winding reduces signal loss in said second resistor means, and so that a portion of said first resistor means provides stabilization means for said emitter electrode.

4. A push-pull transistor amplifier including in combination first and second transistors having respective base emitter and collector electrodes, potential supply means, means directly coupling said collector electrodes to a reference point, an input transformer having winding portions respectively coupled across the base and emitter electrodes of said first and second transistors for supplying input signals to said transistors, an output transformer having a primary winding coupled between the emitter electrodes of said first and second transistors and having a tap point coupled to said potential supply means, said output transformer further including first and second secondary windings in which appear signals corresponding to output signals and induced from said primary winding, first resistor means coupled between a reference point and said primary winding of said output transformer, means coupling said first secondary winding between an intermediate point of said first resistor means and a winding portion of said input transformer to apply a bias potential to said base electrode of said first transistor from said first resistor means, second resistor means coupled between a reference point and said primary winding of said output transformer, means coupling said second secondary winding between an intermediate point of said second resistor means and a winding portion of said input transformer to apply a bias potential to said base electrode of said second transistor from said second resistor means, so that the signals induced in said first and second secondary windings reduce signal loss in said first and second resistor means.

5. A signal amplifier including in combination, a transistor having base, emitter and collector electrodes, means coupling said collector electrode to a common point, output circuit means including an output transformer winding, first circuit means coupling said output transformer winding to a source of potential related to the common point, second circuit means coupling said output transformer winding to said emitter electrode, input circuit means including an impedance element and an input transformer having a secondary winding, said secondary winding and said impedance element being series coupled respectively in the order named between said base electrode and said second circuit means, bias resistor means coupled to said output transformer winding and to the common point to provide voltage divider action of the potential from the source, and further inductor means inductively coupled to said output transformer winding and series coupled with at least a portion of said bias resistor means between the common point and said secondary winding, said further inductor means being phased to provide a signal corresponding to the output signal at said impedance element and said secondary winding in said input circuit means so that signal loss through said bias resistor means is minimized.

6. A transistor amplifier including in combination, a transistor having base, emitter and collector electrodes, potential supply means, means coupling said collector electrode directly to a reference point, an input transformer having a secondary winding coupled to said base electrode to apply input signals thereto, capacitor means connected from said secondary winding to said emitter electrode, an output transformer having a first winding coupled from said emitter electrode to said potential supply means for developing output signals from said transistor, said output transformer having a second winding in which is developed a signal corresponding to the output signals in said first winding, said output transformer further having a speaker matching winding, resistor means connecting said speaker matching winding in series between the common point and said first winding to form a potential divider to provide a bias for said base electrode, and means connecting said potential divider through said second winding to said secondary winding of said input transformer so that the signal inducted in said second and speaker matching windings minimizes conduction of signals from said capacitor means through said resistor means.

7. An amplifier circuit including in combination a transistor having base, emitter and collector electrodes, an output transformer having first and second windings, means direct current coupling said first winding to said emitter electrode, an energizing circuit for supplying a direct current energizing potential between said collector electrode and said first winding, an input circuit for supplying signals to said transistor and including an input winding and series coupled impedance means direct current coupled respectively between said base electrode and said emitter electrode, a first bias resistor direct current coupled to said potential supply means, direct current coupling means interconnecting said second transformer winding between said first bias resistor and said input winding to form a base bias network for said transistor, a second bias resistor direct current connected between said base bias network and said first winding to provide voltage divider action with said first bias resistor, said second winding being phased with respect to said first winding to develop a signal corresponding to the signal from said first winding for reducing the signal shunting effect of said first bias resistor on said first winding, and means for deriving amplifier output signals from said first winding.

8. An amplifier circuit including in combination, a transistor having base, emitter and collector electrodes, means directly connecting said collector electrode to a reference point, means for supplying a direct current energizing potential with respect to the reference point, an output transformer having first and second windings with said first winding coupled in an energizing circuit between said emitter electrode and said means for supplying a potential, input circuit means for applying signals to said amplifier circuit including an input transformer winding coupled to said base electrode, means forming a voltage divider across said means for supplying a potential and including a resistor coupled to the reference point and coupled in series with said second winding and said input winding to said base electrode for biasing such electrode, said input circuit means including an impedance element coupled between said input transformer winding and said emitter electrode so that said impedance element is also coupled between said first and second windings, and means for deriving output signals from said first winding, said second winding being phased with respect to said first winding to develop signals therein corresponding to the output signals and of opposite phase thereto for minimizing flow of output signal current through said impedance element.

References Cited in the file of this patent

UNITED STATES PATENTS

| | | |
|---|---|---|
| Re. 23,563 | Barney | Oct. 14, 1952 |
| 2,663,766 | Meacham | Dec. 22, 1953 |
| 2,663,796 | Raisbeck et al. | Dec. 22, 1953 |
| 2,680,160 | Yaeger | June 1, 1954 |
| 2,757,243 | Thomas | July 31, 1956 |
| 2,774,826 | Moulon | Dec. 18, 1956 |
| 2,784,262 | Crow | Mar. 5, 1957 |
| 2,812,388 | Thomas | Nov. 5, 1957 |

OTHER REFERENCES

Shea text, "Principles of Transistor Circuits," page 121, pub. 1953 by John Wiley & Sons, N.Y.C.